United States Patent [19]

Parker

[11] 4,290,027
[45] Sep. 15, 1981

[54] FAIL-SAFE ACTIVE BANDPASS FILTER USING A MODIFIED TWIN-T FILTER

[75] Inventor: John W. Parker, Rochester, N.Y.

[73] Assignee: General Signal Corporation, Stamford, Conn.

[21] Appl. No.: 97,573

[22] Filed: Nov. 26, 1979

[51] Int. Cl.³ .................... H03H 11/12; H03H 7/065
[52] U.S. Cl. ................................. 330/293; 330/206; 333/172
[58] Field of Search ............... 333/169, 170, 172, 167; 330/293, 202, 291, 260, 303, 306, 97

[56] References Cited

U.S. PATENT DOCUMENTS

| | | | |
|---|---|---|---|
| 3,174,111 | 3/1965 | Grover | 333/172 X |
| 3,725,802 | 4/1973 | Darrow | 333/172 X |
| 4,001,710 | 1/1977 | Darrow | 333/172 X |

Primary Examiner—Marvin L. Nussbaum
Attorney, Agent, or Firm—Milton E. Kleinman; John Ohlandt

[57] ABSTRACT

A fail-safe active bandpass filter circuit is disclosed; that is, one having voltage gain and which is arranged to be fail-safe in the sense that opens, shorts and component value changes will not cause the circuit to self-oscillate and thereby produce a spurious signal that would cause unsafe effects.

9 Claims, 1 Drawing Figure

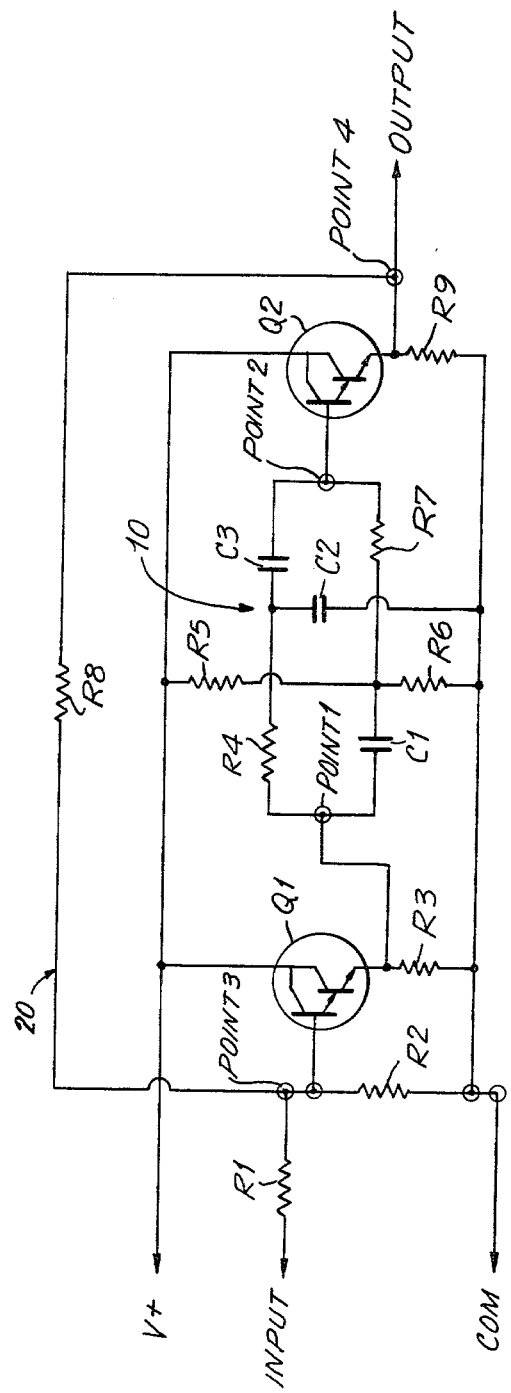

FAIL-SAFE ACTIVE BANDPASS FILTER USING A MODIFIED TWIN-T FILTER

BACKGROUND, OBJECTS AND SUMMARY OF THE INVENTION

This invention relates to fail-safe control circuitry, and in particular, to circuitry that is particularly adapted for vehicle transportation control such that it must have fail-safe characteristics.

A basic requirement imposed on circuitry for controlling transportation systems is that it be fail-safe; that is to say, if a malfunction should occur, this should result in the activation of a device or the application of emergency equipment in such a way as to protect the passage of the vehicle and the security of its passengers.

Accordingly, in the design of control circuitry and, more particularly, in the design and construction of an active bandpass filter to be utilized in control circuitry or in a sub-system of a railroad control system, it is mandatory that such filter also possess fail-safe characteristics, by which is meant that it should not develop a spurious signal due to self-oscillation so as to produce unsafe effects.

Concomitantly with the objective of utilizing an active bandpass filter in certain applications is the need to construct such a filter such that it will have minimum space requirements and not require the use of inductors. Moreover, because of the small sizes made practical for filter applications, the possibility exists of replacing much bulkier devices such as decoder transformers used in detecting rate codes in certain kinds of apparatus.

In order to furnish the man skilled in the art with background material for the present invention, reference may be made to a Dec. 5, 1973 article in EDN by James J. Murphy entitled, "Derive Parallel T Current Gain Filters from Voltage-Null Network". That article describes certain modifications to a general parallel-T RC network useful as a voltage-null frequency selective network.

Accordingly, it is a primary object of the present invention to provide an active bandpass filter which has fail-safe characteristics.

Another object is to provide such a filter when it does not involve the use of inductors or the like.

A further object is to provide an active filter for control purposes that can replace much bulkier components in control systems.

The above and other objects are fulfilled by a primary feature of the present invention according to which the filter circuit comprises essentially two sections, the first of which forms a modified twin-T filter network, and the second of which includes a number of resistors which form a feedback path and attenuator. A pair of emitter follower buffers which have high input impedance and low output impedance serve to isolate the aforenoted two sections from each other. Each of these buffers includes a transistor and suitable output resistor Other and further objects, advantages and features of the present invention will be understood by reference to the following specification in conjunction with the annexed drawing, wherein like parts have been given like numbers.

DESCRIPTION OF DRAWING

The FIGURE is a schematic diagram of the fail-safe active bandpass filter in accordance with the preferred embodiment of the present invention.

DESCRIPTION OF THE PREFERRED EMBODIMENT

Referring now to the FIGURE in which there is illustrated a schematic diagram of the filter circuit in accordance with a preferred embodiment, there will be seen the first or main section 10 comprising resistors R4, R5, R6, and R7; also, capacitors C1, C2 and C3. This main section constitutes the aforesaid modified twin-T network, which is a passive bandpass filter network with the unusual property that it provides a voltage gain from its input (point 1 in the FIGURE) to its output (point 2). This voltage gain has a theoretical maximum value of 1.2071 which may be approached rather closely in practice by suitable selection of component values. Such a practical selection will be presented hereinafter.

Changes in the aforenoted component values within the network or section 10 will cause the network to shift away from this optimum operation point such that the overall network gain will tend to decrease. The network phase shift at this operating point is zero degrees and the Q of this network is rather low, having a maximum value of approximately 0.35.

Referring back to the FIGURE, the second section of the filter circuit is designated 20 and essentially consists of the resistors R1, R2 and R8, which are so arranged in a divider network as to provide a feedback path, as will be seen in the FIGURE from output to input, and an attenuator.

Transistor Q1 and resistor R3 form an input buffer amplifier, in an emitter follower configuration, which isolates the network input from its source. Transistor Q2 and resistor R9, likewise arranged in an emitter follower configuration, form an output buffer amplifier which isolates the network from its load. Transistors Q1 and Q2 are selected to be high current gain Darlington transistors which, in the emitter follower configuration used, have a voltage gain very near but slightly less than one. Therefore, the overall voltage gain from point 3 to point 4, as seen on the FIGURE, is approximately that of the twin-T network, that is, a maximum of 1.2071.

It is known from control theory that a system will be stable if its overall loop gain is less than 1 at a phase shift of zero degrees. The loop gain of the filter circuit of the invention consists of the voltage gain provided (from point 3 to point 4) by the modified twin-T network and buffer emitter followers (such combination having a theoretical maximum gain of 1.2071), times the attenuation provided by the resistor network of the second section 20, that is, the resistors R1, R2 and R8. Accordingly, the loop gain for the filter circuit can be fixed at less than one by appropriate selection of the values of R1, R2 and R8. The value of R1 is selected to be much greater than R2 or R8 so that the attenuation is essentially fixed by the resistor divider formed by R8 and R2. So long as the attenuation provided by the combination of R8 and R2 is sufficiently greater than the gain of the twin-T filter network so that the product is less than one, the circuit is stable. In order to ensure stability, R2 must be a so-called "established reliability" resistor. This type or kind of resistor is per se well-known in the art and can be appreciated by reference to a "Report on Special Fail-Safe Circuit Components for Use in WMATA Circuit Design" (Sections IV and V), available from General Railway Signal Co, Rochester, N.Y. (1974). This reliability resistor R2 is connected in what is called a four terminal configuration so that it cannot open and thereby produce self-oscillation of the circuit.

On the other hand, the resistors R1 and R8 must be increasing only failure mode components; that is to say, these resistors are selected such that their only possibility of failure is to increase in resistance value, whereby they cannot cause self-oscillation for the circuit. These resistors R1 and R8 are selected to be of the type known as RN 60 resistors which basically are metal film resistors having the required failure mode, that is, they can only increase their resistance or open. This characteristic can be appreciated by reference to Section II of the aforenoted report.

As a result of the aforenoted selection, of the critical components R1, R2 and R8, it is ensured that there can only be an increase in attenuation and thus an increase in circuit stability.

Overall circuit Q is set by adjusting resistors R1 and R8. The closer the loop gain approaches 1, the higher the circuit Q becomes. Therefore, by decreasing R8, Q increases. Additionally, as Q becomes greater, the circuit impedance looking into the base of transistor Q1 becomes larger at the center frequency of the filter network. By making R1 larger, Q can be increased at the expense of insertion loss. The center frequency of the filter is determined by the center frequency of the twin-T bandpass network as will be apparent.

In order to provide a detailed set of specifications so that a man skilled in the art can construct a filter circuit in accordance with the present description, the following is provided: a test filter circuit was built at a center frequency of 100 Hz and a safety failure analysis was performed. The unit was found to be stable so long as the critical components R2 and R8 were held within limits. By adjusting resistor R8, a Q of 10 with an insertion loss of 3.8 DB was obtained. By increasing R1, a Q of 25 was achieved with an insertion loss of 8.9 DB. Typical values that were selected were as follows:

fo=100 Hz (frequency of minimum transmission)
Q=10

R1—100 K film resistor
R2—10 K established reliability (four terminal configuration)
R3—1 L
R4—1.58 L
R5—7.68 L
R6—7.68 K
R7—158 K
R8—2.21 K film resistor
R9—1 K

C1—1μF
C2—0.41μF
C3—0.01μF

Q1 & Q2—2N6427

While there has been shown and described what is considered at present to be the preferred embodiment of the present invention, it will be appreciated by those skilled in the art that modifications of such embodiment may be made. It is therefore desired that the invention not be limited to this embodiment, and it is intended to cover in the appended claims all such modifications as fall within the true spirit and scope of the invention.

What is claimed is:

1. A fail-safe active bandpass filter circuit comprising:
   a first section including a twin-T filter network, which has a plurality of resistors and capacitors, connected between a first point and a second point, the voltage gain of said network being greater than one;
   a power source connected to said twin-T network;
   a second section including a first resistor connected between a common or reference point and the input of said twin-T network;
   a second, feedback resistor connected from the output to the input of said twin-T network such that the loop gain is less than one.

2. A filter circuit as defined in claim 1 in which a third resistor is connected to the input of said network and to a common junction point between said first and second resistors.

3. A filter circuit as defined in claim 2, further comprising a first transistor buffer amplifier for isolating said network from its source.

4. The circuit as defined in claim 3, including a second transistor buffer amplifier serving to isolate the output of said network from its load.

5. The circuit as defined in claim 4 in which each of said buffer amplifiers comprises a Darlington transistor connected in an emitter follower configuration.

6. The circuit as defined in claim 5 in which a fourth resistor is provided at the emitter output of each of said transistors.

7. The circuit as defined in claim 6 in which said network includes a fifth and sixth resistor connected in series with said power source, the junction between said resistors being connected to a first capacitor, the other end of which is connected to said fourth resistor at the output of said first buffer amplifier, said circuit further including a seventh resistor connected to said junction point and to the input of said second buffer amplifier, a second capacitor connected between the common or reference point and a junction point between an eighth resistor and a third capacitor.

8. A filter circuit as defined in claim 2 in which said first resistor is selected to be an established reliability resistor such that it cannot open.

9. A filter circuit as defined in claim 2 in which said second and third resistors are selected such that their only failure mode results in their resistance increasing whereby the circuit's stability can only increase.

* * * * *